United States Patent [15] 3,691,427

Honda et al. [45] Sept. 12, 1972

[54] PROTECTIVE CIRCUIT FOR AN ALL STAGE DIRECT-COUPLED TRANSISTOR OUTPUT TRANSFORMERLESS-OUTPUT CONDENSERLESS AMPLIFIER

[72] Inventors: Masatsugu Honda, Odawara; Masanobu Shinozaki, Sagamihara, both of Japan

[73] Assignee: Victor Company of Japan, Ltd., Kanagawa-ku, Yokohama, Kanagawa-ken, Japan

[22] Filed: March 29, 1971

[21] Appl. No.: 128,865

[30] Foreign Application Priority Data

March 29, 1970 Japan ....................45/29640
June 14, 1970 Japan ....................45/51252

[52] U.S. Cl...............317/31, 317/33 R, 330/207 P, 307/202, 307/94, 317/36 TD

[51] Int. Cl...........................................H02h 3/20

[58] Field of Search..................317/33 R, 31, 36 TD; 330/207 P, 51; 307/202, 94; 321/11; 331/62

[56] References Cited

UNITED STATES PATENTS

| | | | |
|---|---|---|---|
| 3,526,845 | 9/1970 | Sikorra | 330/207 P |
| 3,555,358 | 1/1971 | Gibbs | 307/202 X |
| 3,544,720 | 12/1970 | Corderman | 307/94 |
| 3,569,781 | 3/1971 | Strachan | 317/33 SC |
| 3,555,360 | 1/1971 | Lee | 317/33 SC |

*Primary Examiner*—J. D. Miller
*Assistant Examiner*—Harvey Fendelman
*Attorney*—Holman & Stern

[57] ABSTRACT

A protective circuit comprises a detecting circuit for detecting an unbalanced DC voltage developed in an output of an all stage direct-coupled transistor output transformerless-output condenserless amplifier and means for disconnecting a load from the amplifier and thereby protecting the load when a detected output is developed in the detecting circuit. The means for protection is so constructed that it will operate irrespective of polarity of the unbalanced DC voltage.

6 Claims, 6 Drawing Figures

Fig. 1 PRIOR APT
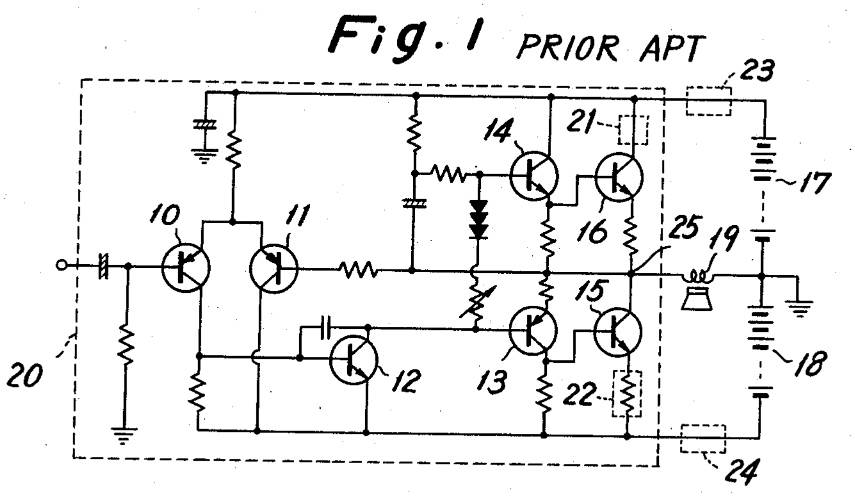
Fig. 2
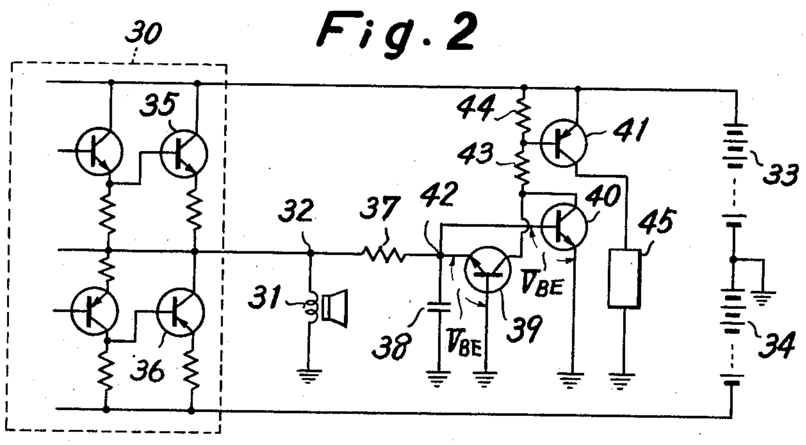

PROTECTIVE CIRCUIT FOR AN ALL STAGE DIRECT-COUPLED TRANSISTOR OUTPUT TRANSFORMERLESS-OUTPUT CONDENSERLESS AMPLIFIER

This invention relates to a protective circuit for an all stage direct-coupled transistor output transformerless amplifier and more particularly to a protective circuit for preventing burning of a load in an all stage direct-coupled transistor output transformerless and output condenserless amplifier.

There is generally employed an all stage direct-coupled transistor output transformerless amplifier (hereinafter referred to as "OTL amplifier") in which all amplifying stages are directly coupled without using coupling condensers between each amplifying stage. An output condenserless amplifier (hereinafter referred to as "OCL amplifier") is a kind of transistor OTL amplifier in which the amplifier and the load are connected in DC without using an output coupling condenser. This OTL-OCL amplifier has excellent characteristics in low frequency and has gradually been used more widely in recent years.

This all stage direct-coupled OTL-OCL amplifier is supplied with operating power by two power sources, one being positive and the other negative. Since the amplifier is connected to the DC power sources through the load, if any one of many amplifier elements which constitute the amplifier is damaged for some reason, unbalanced DC voltage is developed in the output of the amplifier resulting in flowing of a large unbalanced DC current through the load. This DC current will burn and destroy the load.

It is therefore necessary to protect the load by preventing burning thereof in case such an unbalanced DC voltage is developed in the amplifier.

It is a general object of this invention to provide a novel and useful protective circuit for an all stage direct-coupled transistor OTL-OCL amplifier satisfying the aforementioned requirement.

Another object of the invention is to provide a circuit which protects the load by detecting an unbalanced DC voltage developed in the output of the amplifier and disconnecting the load from the amplifier.

A further object of the invention is to provide a circuit which has an excellent dynamic sensitivity protecting the load by immediately detecting even a relatively small unbalanced DC voltage developed in the amplifier.

A still further object of the invention to provide a protective circuit for an all stage direct-coupled transistor OTL-OCL amplifier which is capable of protecting the load without reproducing a ripple noise or a shock noise at the time of closing the power source.

Other objects and features of the invention will become apparent from the description made hereinbelow with reference to the accompanying drawings, in which:

FIG. 1 is a circuit diagram of one example of a conventional all stage direct-coupled transistor OTL-OCL amplifier;

FIG. 2 is a circuit diagram of one embodiment of an unbalanced DC voltage detecting circuit according to the invention;

Figure 3:
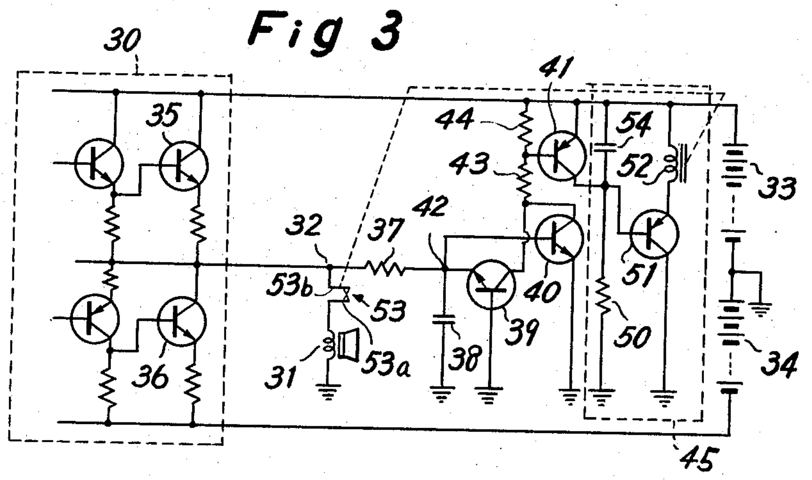
FIG. 3 is a circuit diagram of a first embodiment of a protective circuit according to the invention.

First, one example of a conventional all stage direct-coupled transistor OTL-OCL amplifier will be illustrated with reference to FIG. 1. Transistors 10 through 16 constitute a power amplifier 20 of a single-ended push-pull (SEPP) amplifier circuit type. This amplifier 20 is supplied with operating power by a positive power source 17 and a negative power source 18. A middle point 25 of the amplifier 20 is connected to the positive and negative power sources 17 and 18 through a load 19, e.g., a voice coil of a speaker. Due to this construction, if any one of many amplifying elements constituting the amplifier 20 is damaged for some reason, an unbalanced DC voltage is developed at the middle point 25 resulting in flowing of an unbalanced DC current of a large magnitude which will burn the load 19.

This circuit operation will be further explained as follows; If an element, e.g., the transistor 10, is damaged for some reason, the transistor 10 becomes non-conductive. This causes the transistors 12, 13 and 15 provided on the negative power source 18 side to become non-conductive. In the meanwhile, as the transistor 12 becomes non-conductive, the potential at the base of the transistor 14 rises. As a result, the transistor 14 provided on the positive power source 17 side becomes conductive and simultaneously the transistor 16 also becomes conductive. The collector current of the transistors 14 and 16 during operation of the above described circuit is a large current amounting to a saturation value. Consequently, a large unbalanced DC current flows through the load 19 and burns the load 19, e.g., a voice coil of a speaker.

In order to prevent the aforementioned accident, a conventional amplifier has used a fuse which is inserted between the power sources 17, 18 and the amplifier 20 and melts and breaks the circuit when an excessive current flows. Another conventional amplifier has adopted a construction in which a resistor for detecting current is inserted in either of parts 21, 22, 23 and 24 shown by broken lines in FIG. 1. In this circuit, a transistor or other element performs a switching action due to voltage which is developed across the detecting resistor and this switching action actuates a relay to disconnect the load from the amplifier by opening of its contacts. However, the aforementioned first conventional amplifier using a fuse does not satisfactorily protect the load because of taking of considerable time before the fuse melts and breaks the circuit. In the second conventional amplifier, a resistor of a low resistance value must be used as the detecting resistor to minimize power and output losses due to the detecting resistor. Hence, this conventional amplifier has a disadvantage that the required detecting output is not obtained unless a large magnitude of current flows through the detecting resistor and, accordingly, a sufficient and sure protection of the load cannot be expected.

The present invention has eliminated the disadvantages of these conventional circuits. FIG. 2 shows one embodiment of the unbalanced DC voltage detecting circuit to be used in the circuit according to the invention. At a connecting point 32 between an all stage direct-coupled transistor OTL-OCL amplifier 30 and a load 31, there is developed a positive voltage by the current flowing from a positive power source 33 to the load 31 by way of the amplifier circuit on a transistor 35 side and a negative voltage by the current flowing from a negative power source 34 to the load 31 by way of the amplifier circuit on a transistor 36 side.

The positive and negative voltage $V$ (an AC voltage) during a normal operation of the amplifier 30 is given by the following equation:

$$W = V^2/RL$$

where $W$ represents value of output power of the amplifier 30 and $RL$ impedance of the load 31. During this normal operation, a positive or negative unbalanced DC voltage $V_o$ appearing in the load 31 is nil or of an extremely small value.

Let it be assumed that the amplifier 30 is placed in an abnormal state in its operation for some reason. A positive or negative unbalanced DC voltage $V_1$ developed at the connecting point 32 is much greater than the positive or negative unbalanced DC voltage $V_o$ developed during the normal operation of the amplifier 30.

In this circuit, transistors 39 and 40 are connected to the connecting point 32 through a low pass filter composed of a resistor 37 and a condenser 38. The emitter of the NPN transistor 39 and the base of the NPN transistor 40 are connected to an output terminal 42 of the low pass filter. The base of the transistor 39 and the emitter of the transistor 40 are respectively grounded. The collectors of the transistors 39 and 40 are both connected to the positive terminal of the positive power source 33 through resistors 43 and 44. Accordingly, when the value of the DC voltage appearing at the output terminal 42 of the low pass filter has exceeded that of respective base-emitter voltage $V_{BE}$ of the transistors 39 and 40, the transistor 39 is placed in a conductive state if the voltage at the output terminal 42 is negative. As a result, electric current flows from the positive power source 33 through the resistor 44, resistor 43, collector and emitter of the transistor 39, resistor 37 and load 31 to the ground. A voltage drop is caused across the resistor 44 by this current placing the transistor 41 in a conductive state. Consequently, electric current flows from the positive power source 33 through the emitter and collector of the PNP transistor 41 and a protective control circuit 45 to the ground thereby operating the protective control circuit 45. If the voltage at the output terminal 42 of the low pass filter is positive, the transistor 40 is placed in a conductive state and electric current flows from the positive power source 33 through the resistor 44, resistor 43 and emitter and collector of the transistor 40 to the ground. In this case, the transistor 41 also operates in the same manner as described above causing electric current to flow through the protective control circuit 45 for operating it. The construction and operation of the protective control circuit 45 will be described later.

The positive and negative output voltage (an AC voltage) $V$ appearing in the load 31 during normal operation of the amplifier 30 has, as described above, the relation represented by the equation $V = \sqrt{RL \cdot W}$ relative to the output $W$ of the amplifier during its normal operation. The voltage $V$ is much larger than the base-emitter voltage $V_{BE}$ of the transistors 39 and 40 (in case the transistors 33 and 40 are silicon transistors, $V_{BE}$ is about 0.6 V). However, the aforementioned voltage $V$ appearing at the connecting point 32 during normal operation of the amplifier 30 is an AC voltage so that no voltage appears at the output terminal 42 of the low pass filter due to provision of the low pass filter. Further, the unbalanced DC current flowing through the load 31 during normal operation of the amplifier 30 is normally very small and the positive or negative unbalanced DC voltage $V_o$ applied to the load 31 is nil or extremely low. Accordingly, the transistors 39 and 40 do not operate while the amplifier 30 is normally operating.

Assuming that, for example, the base-emitter voltage $V_{BE}$ of the transistors 39 and 40 is 0.6 V and the load 31 is 8 Ω, when an unbalanced DC current of 75 mA flows through the load 31, a positive or negative unbalanced DC voltage of 0.6 V is developed across the load 31. This voltage operates either the transistor 39 or 40.

Thus, the detecting circuit having the above described construction is capable of detecting only the unbalanced DC voltage applied to the load 31 by applying the voltage developed across the load 31 to the detecting transistors 39 and 40 through the low pass filter. Further, the detecting circuit can accurately detect even a small unbalanced DC current flowing through the load 31.

Nextly, each embodiment of the protective circuit which, employing the aforementioned detecting circuit, releases the load 31 from the amplifier 30 by the detected output of the detecting circuit will be illustrated with reference to FIGS. 3 to 5.

Let it be assumed that in FIG. 3 a negative or positive unbalanced DC current flows through the load 31 for some reason whereby a negative or positive unbalanced DC voltage which is larger than the value of the base-emitter voltage $V_{BE}$ of the transistors 39 and 40 is developed across the load 31. In this case, if the unbalanced DC voltage is negative, the transistor 39 will operate and if the unbalanced DC voltage is positive, the transistor 40 will operate. In either case of the above cases, the transistor 41 operates as described in the foregoing. Consequently, electric current flows from the positive power source 33 through the emitter and collector of the transistor 41 to the ground thereby placing a transistor 51 in a conductive state. As the transistor 51 becomes conductive, electric current flows from the positive power source 33 through a relay 52 and the emitter and collector of the transistor 51 to the ground thereby operating the relay 52. The operation of the relay 52 actuates normally closed relay contacts 53 connected between the connecting point 32 and the load 31 causing its movable contact 53*b* to be separated from its fixed contact 53*a*. Thus the relay contacts 53 are opened and the load 31 is disconnected from the amplifier 30, whereby the load 31 is effectively protected from the damage due to the unbalanced DC current.

This operation continues after the load 31 is disconnected from the amplifier 30 as long as the voltage at the output terminal 42 remains larger than a value at which the transistors 39 and 40 become conductive. In case the load 31 is disconnected from the amplifier 30, the amplifier 30 continues to operate, being connected to a single power source consisting of the positive power source 33 and the negative power source 34 connected in series. At the middle point of the amplifier 30, i.e. the connecting point of the circuit including the transistor 35 and the circuit including the transistor 36 (in the present embodiment the potential at the middle point is equal to that at the connecting point 32), there is developed a positive or negative unbalanced DC voltage because the amplifier 30 is in an abnormal operation.

Figure 4:
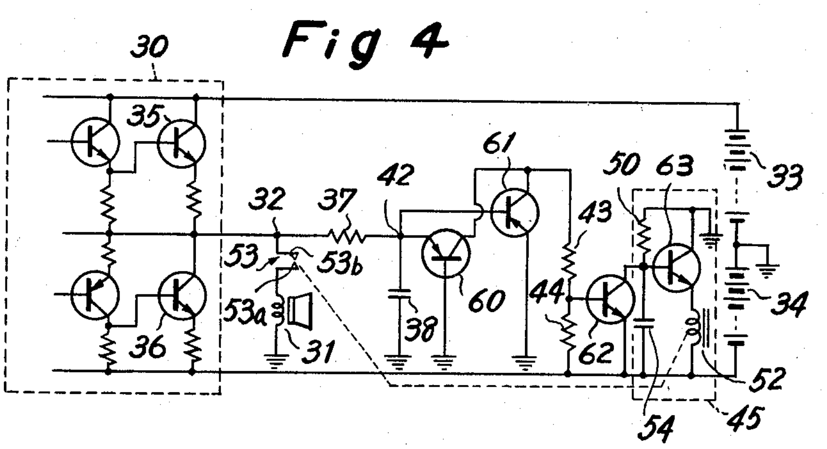
FIG. 4 is a circuit diagram of a second embodiment of a protective circuit according to the invention.

FIG. 4 shows the second embodiment of the protective circuit according to the invention. In this embodiment, PNP transistors 60 and 61 are used instead of the NPN transistors 39 and 40 used in the aforementioned embodiment and NPN transistors 62 and 63 instead of the PNP transistors 41 and 51. In this embodiment, the resistor 44, the emitter of the transistor 62, the condenser 54 and the relay 52 etc. are connected to the negative power source 34. Description about the operation of the circuit of this embodiment is omitted since it will easily be understood from the above described operation of the first embodiment.

Figure 5:
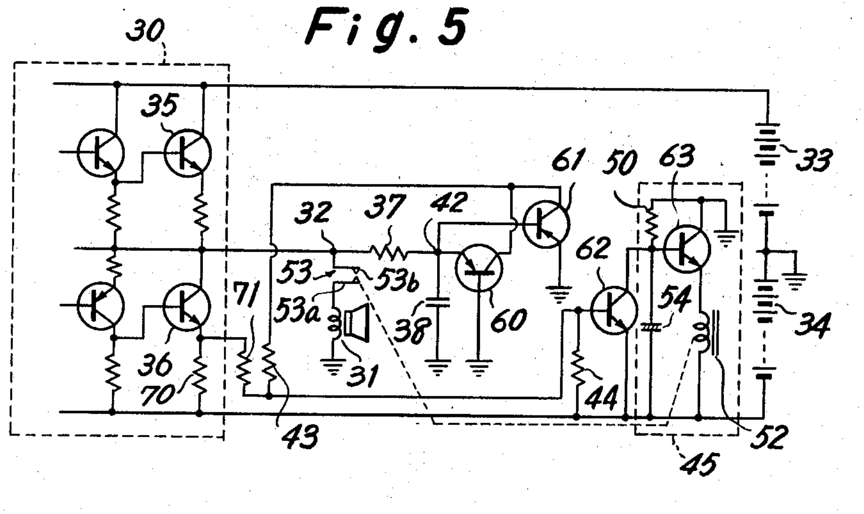
FIG. 5 is a circuit diagram of third embodiment of a protective circuit according to the invention.

FIG. 5 shows the third embodiment of the protective circuit according to the invention. The protective control circuit 45 operates will the same circuit construction as that shown in FIG. 4. In addition, an excessive current of the amplifier 30 is taken out of an emitter resistor 70 of the output transistor 36 of the amplifier 30 and applied to the base of a transistor 62 through a resistor 71. The excessive current of the amplifier 30 flows, for instance, when the load 31 is short-circuited. The relay 52 connected to the emitter of a transistor 63 is operable both when the unbalanced DC voltage has exceeded a certain fixed value and when an excessive current flows in the amplifier 30.

In this embodiment, the resistor 70 for detecting an excessive current is inserted in the circuit including the transistor 36. However, the circuit will operate equally well even if the resistor 70 is inserted in the circuit including the transistor 35 or in the power source circuit.

Figure 6:
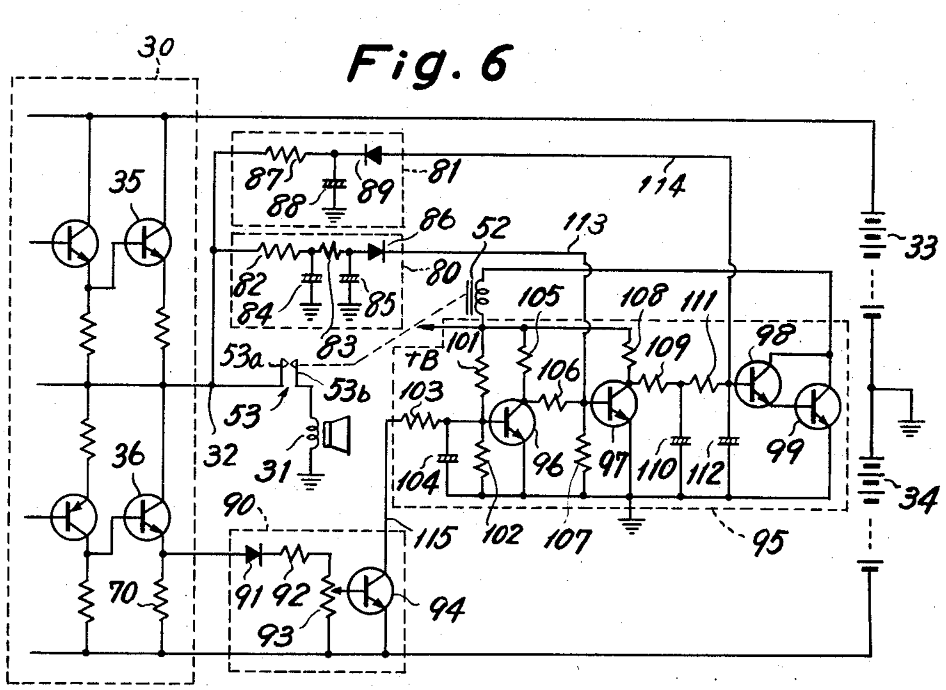
FIG. 6 is a fourth embodiment of a protective circuit according to the invention.

The fourth embodiment of the protective circuit according to the invention will be illustrated with reference to FIG. 6. As described in the foregoing, the potential at the connecting point 32 of the amplifier 30 and the load 31 is equal to that at the middle point of the amplifier 30 and is at a ground potential in DC while the amplifier 30 is in normal operation. If the amplifier 30 is placed in an abnormal state in its operation for one reason or another, a positive or negative unbalanced potential appears at the connecting point 32.

Detecting circuits 80 and 81 are respectively connected to the connecting point 32 and detects a positive or negative unbalanced DC voltage component developed at the connecting point 32 by an abnormal operation of the amplifier 30. The detecting circuit 80 consists of a low pass filter circuit composed of resistors 82 and 83, condensers 84 and 85 and a forward diode 86. The detecting circuit 80 develops a detected output voltage on its output side when a positive DC potential is developed at the middle point of the amplifier 30. The detecting circuit 81 consists of a low pass filter circuit composed of a resistor 87, a condenser 88 and reverse diode 89. The detecting circuit 81 develops a detected output voltage when a negative DC potential is developed at the middle point of the amplifier 30.

A detecting circuit 90 is connected to the emitter of the transistor 36. Voltage developed across an emitter resistor 70 connected to the emitter of the transistor 36 is applied to the base of a transistor 94 through a diode 91, a resistor 92 and a variable resistor 93. The transistor 94 is switched on and off by this voltage applied thereto. The diode 91 is not absolutely necessary for the circuit and the circuit can sufficiently perform its detecting operation even if the diode 91 is not inserted in the circuit. In an apparatus using a plurality of amplifiers, e.g. a stereophonic reproducing apparatus, one detecting circuit 90 may be commonly used for such plurality of amplifiers. In such case the diode 91 will be required so as to prevent mixing of each channel signal.

The detected output voltages in the detecting circuits 80, 81 and 90 are respectively supplied to a switching circuit 95. The switching circuit 95 comprises transistors 96 through 99 respectively performing a switching operation. A base bias is supplied to the base of the transistor 96 by resistors 101 and 102 whereby the transistor 96 is normally in a conductive state. To the base of the transistor 96 there is connected, by means of a line 115, the collector of the transistor 94 of the detecting circuit 90 through a resistor 103. When the transistor 94 of the detecting circuit 90 operates, voltage drop across the resistor 101 increases thereby placing the transistor 96 in a non-conductive state. Again, a condenser 104 is connected between the base of the transistor 96 and the ground. Due to provision of this condenser 104, time lag occurs in the rise of the potential at the base of the transistor 96 when the power source is closed. Consequently, the relay 52 starts its operation only when a certain time has elapsed after closing of the power source.

A resistor 105 is connected between the collector of the transistor 96 and the +B power source. A resistor 106 is connected between the collector of the transistor 96 and the base of the transistor 97. A resistor 107 is connected between the base of the transistor 97 and the ground.

When the transistor 96 becomes non-conductive, the voltage drop across the resistor 105 decreases and the base potential of the transistor 97 rises thereby placing the transistor 97 in a conductive state. The transistor 97 also becomes conductive when a detected output is supplied from the detecting circuit 80 to the base of the transistor 97 by way of a line 113. Accordingly, the transistor 97 is normally in a non-conductive state.

The collector of the transistor 97 is connected to resistors 108 and 109 and to the base of the transistor 98 through resistors 109 and 111. A condenser 110 is connected between the connecting point of the resistors 109 and 111 and the ground. A condenser 112 is connected between the base of the transistor 98 and the ground. By the provision of the condensers 110 and 112, time lag occurs in the variations at the base of the transistor 98.

An output line 114 of the detecting circuit 81 is connected to the base of the transistor 98 and when there is a detected output in the detecting circuit 81, the transistor 98 becomes non-conductive. The transistor 98 also becomes non-conductive with certain time lag when the transistor 97 becomes conductive. The transistors 98 and 99 are mutually multi-coupled. Between the collectors of the transistors 98 and 99 and the +B power source, there is connected the relay 52. While the transistors 98 and 99 are in a conductive state, which is normally the case, the contacts 53 of the relay 52 are closed and the load 31 is connected to the connecting point 32.

In the circuit having the foregoing construction, operation of the circuit when the power source is closed will be described first.

Upon closing of the power source, the transistor 96 is maintained in a non-conductive state until the condenser 104 which is connected to the base thereof is charged. The transistor 97 is in a conductive state during the time after the closing of the power source until the transistor 96 becomes conductive. Accordingly, the transistors 98 and 99 are in a non-conductive state while the transistor 97 is in a conductive state. The non-operating state of the transistor 98 is ensured by providing a time constant circuit to the base circuit of the transistor 98. Namely, the voltage at the connecting point with the resistors 108 and 109 is regarded to have sufficiently dropped by conduction of the transistor 97. In addition, since this voltage charges the condensers 110 and 112 through resistance, the base potential of the transistor 98 gradually rises from a sufficiently low value.

When the condenser 104 connected to the base of the transistor 96 has been charged and the transistor 96 is shifted from a non-conductive state to a conductive state, the transistor 97 is immediately shifted from a conductive state to a non-conductive state. Then, after the lapse of time due to time lag, the transistors 98 and 99 are shifted from a non-conductive state to a conductive state. By conduction of the transistors 98 and 99, the relay 52 operates to close the contacts 53 thereby connecting the load 31 to the amplifier 30.

In the above described operation upon closing of the power source, the load 31 is connected to the amplifier 30 with some time lag so that ripple component of the power source or shock noise component at the time of closing the power source which appears in the output of the amplifier 30 is not supplied to the load 31.

Nextly, the operation of the circuit in the case where abnormality which occurs in the amplifier 30 causes a positive or negative DC voltage to appear in the middle point potential will be described. First, if a positive DC voltage appears at the point 32, the output of the detecting circuit 80 causes the base potential of the transistor 97 to rise. This causes the transistor 97 to shift from a non-conductive state to a conductive state. Then, the transistors 98 and 99 are shifted from a conductive state to a non-conductive state. The relay 52 is placed in a non-operating state whereby the contacts 53 are opened and the load 31 is disconnected from the amplifier 30.

If a negative DC voltage appears at the point 32, the output of the detecting circuit 81 causes the base potential of the transistor 98 to drop. This causes the transistors 98 and 99 to shift from a conductive state to a non-conductive state placing the relay 52 in a non-operating state. Consequently, the contacts 53 are opened in the same manner as previously described whereby the load 31 is disconnected from the amplifier 30.

Thus, in the circuit according to this embodiment, if a positive or negative DC voltage is developed at the middle point potential of the amplifier 30, this voltage is accurately detected and the load 31 is immediately disconnected from the amplifier 30 whereby the load 31 is perfectly protected from burning and damage.

Further, the operation of the detecting circuit 90 will be described. If an excessive current flows through the load 31 due to accidents such as short-circuiting in the load 31, the transistor 94 shifts from a non-conductive state to a conductive state by voltage developed across the emitter resistor 70 of the transistor 36. This causes the transistor 96 which has been in a conductive state to become non-conductive. Then the transistor 97 becomes conductive and the transistors 98 and 99 become non-conductive. This places the relay 52 in a non-operating state whereby the contacts 53 are opened and the load 31 is disconnected from the amplifier 30.

As described in the above description, in the case where the load 31 is disconnected from the amplifier 30, the voltage developed across the emitter resistor 70 of the transistor 36 decreases instantaneously. As a result, the transistor 94 of the detecting circuit 90 instantaneously becomes non-conductive but the transistors 98 and 99 again become conductive with some time lag caused by the existence of the condensers 104 and 110 and resistors 101, 109 and 111 in the same manner as described previously with regard to the operation at the time of closing the power source. The load 31 is again connected to the amplifier 30 by closing of the contacts 53 of the relay 52. If the load 31 is still in a short-circuited state, the foregoing operation will be repeated.

While the invention has been described with respect to the specific preferable embodiment, various modifications and variations thereof will be apparent to those skilled in the art without departing from the scope of which is set forth in the appended claims.

What we claim is:

1. A protective circuit for an all stage direct-coupled transistor output transformerless-output condenserless amplifier supplied with operating power by positive and negative power sources, said protective circuit comprising: a detecting means for detecting an unbalanced DC voltage in the output of said amplifier, said detecting means including a low pass filter means connected to the output terminal of said amplifier for taking out only a DC voltage component in the output of said amplifier; an opening and closing means for opening and closing between said amplifier and a load; and a control circuit means for controlling the operation of said opening and closing means, said control circuit means including a first transistor which is grounded at the base thereof and to which the output of said low pass filter means is applied at the emitter thereof, a second transistor which is grounded at the emitter thereof and to which the output of said low pass filter means is applied at the base thereof, either of said first transistor or said second transistor becoming conducting when the positive or negative voltage of the DC voltage component taken out by said low pass filter means and applied to said transistors has exceeded a base-emitter voltage of said transistors; said opening and closing means disconnecting said load from said amplifier in response to the conduction current of said transistors and thereby protecting said load.

2. The protective circuit as defined in claim 1 wherein said opening and closing means comprises relay contacts connected between said amplifier and said load and a relay for driving said relay contacts, said relay being operated by conduction of either of said first or second transistors.

3. A protective circuit for an all stage direct-coupled transistor output transformerless-output condenserless amplifier supplied with operating power by positive and negative power sources, said protective circuit comprising: a detecting means for detecting an unbalanced DC voltage in the output of said amplifier, said detecting means including a first detecting circuit which is composed of a first low pass filter circuit for taking out only the positive DC voltage component in the output of said amplifier and a forward diode, and a second detecting circuit which is composed of a second low pass filter circuit for taking out only the negative DC voltage component in the output of said amplifier and a reverse diode; an opening and closing means for opening and closing between said amplifier and a load; and a control circuit means for controlling the operation of said opening and closing means, said control circuit means including a first transistor which is connected to said opening and closing means and is connected at the base thereof to said second detecting circuit, and a second transistor which is connected to said first transistor to shift the state of operation of said first transistor and which is connected at the base thereof to said first detecting circuit, said first transistor normally being in a conductive state and said second transistor normally being in a non-conductive state, said first transistor becoming non-conductive when the positive or negative voltage of the DC voltage components taken out by said first and second low pass filter circuits and applied to said first and second transistors has exceeded a base-emitter voltage of the transistors; said opening and closing means disconnecting said load from said amplifier corresponding to the non-conductive state of said first transistor and thereby protecting said load.

4. The protective circuit as defined in claim 3 wherein said opening and closing means comprises relay contacts connected between said amplifier and said load and a relay for driving said relay contacts, said relay being connected to said first transistor and opening said relay contacts in response to non-conduction of said first transistor.

5. The protective circuit as defined in claim 3 which further comprises a condenser for producing a time delay connected to the base circuit of said first transistor.

6. The protective circuit as defined in claim 3 wherein said detecting means further comprises a third detecting circuit for detecting an excessive electric current flowing through said load, and wherein said control circuit means further comprises a third transistor which is connected to said second transistor so as to shift the state of operation of said second transistor and which is connected at the base thereof to said third detecting circuit.

* * * * *